United States Patent
Lee

(10) Patent No.: US 8,253,322 B2
(45) Date of Patent: Aug. 28, 2012

(54) ORGANIC LIGHT EMITTING DISPLAY DEVICE INCLUDING LIGHT ABSORPTION PATTERN UNIT

(75) Inventor: Dong-Kyu Lee, Suwon-si (KR)

(73) Assignee: Samsung Display Co., Ltd., Yongin (KR)

( * ) Notice: Subject to any disclaimer, the term of this patent is extended or adjusted under 35 U.S.C. 154(b) by 189 days.

(21) Appl. No.: 12/348,098

(22) Filed: Jan. 2, 2009

(65) Prior Publication Data
US 2009/0236976 A1 Sep. 24, 2009

(30) Foreign Application Priority Data
Mar. 19, 2008 (KR) .................. 10-2008-0025372

(51) Int. Cl.
*H01L 51/00* (2006.01)
(52) U.S. Cl. ........................ 313/504; 313/506
(58) Field of Classification Search .............. 313/504, 313/506, 112, 512
See application file for complete search history.

(56) References Cited

U.S. PATENT DOCUMENTS

| | | | |
|---|---|---|---|
| 5,445,898 A | 8/1995 | Budzilek et al. | |
| 6,781,162 B2 * | 8/2004 | Yamazaki et al. | 257/184 |
| 7,074,307 B2 * | 7/2006 | Simpson et al. | 204/403.04 |
| 2003/0146695 A1 * | 8/2003 | Seki | 313/506 |
| 2003/0222575 A1 * | 12/2003 | Yamazaki et al. | 313/504 |
| 2005/0073243 A1 * | 4/2005 | Yamazaki et al. | 313/498 |
| 2005/0073247 A1 * | 4/2005 | Yamazaki et al. | 313/503 |
| 2005/0195318 A1 * | 9/2005 | Komatsu et al. | 348/370 |

FOREIGN PATENT DOCUMENTS

| | | |
|---|---|---|
| JP | 2000-294380 | 10/2000 |
| JP | 2004-281402 | 10/2004 |
| JP | 2008-10417 | 1/2008 |
| KR | 1996-7000622 | 1/1996 |

OTHER PUBLICATIONS

Korean Registration Determination Certificate issued on May 31, 2010, in corresponding Korean Patent Application No. 10-2008-0025372.

Korean Office Action dated Nov. 30, 2009, issued in corresponding Korean patent application.

* cited by examiner

*Primary Examiner* — Karabi Guharay
(74) *Attorney, Agent, or Firm* — Christie, Parker & Hale, LLP

(57) ABSTRACT

An organic light emitting display device includes a substrate, a display unit that is formed on the substrate, and includes a plurality of organic light emitting regions that emit light, a sealing member disposed above the display unit, and one or more light absorption pattern units formed on a plurality of non-light emitting regions of the display unit.

18 Claims, 3 Drawing Sheets

ORGANIC LIGHT EMITTING DISPLAY DEVICE INCLUDING LIGHT ABSORPTION PATTERN UNIT

CROSS-REFERENCE TO RELATED APPLICATION

This application claims the benefit of Korean Application No. 2008-25372, filed Mar. 19, 2008, in the Korean Intellectual Property Office, the disclosure of which is incorporated herein by reference.

BACKGROUND OF THE INVENTION

1. Field of the Invention

Aspects of the present invention relate to an organic light emitting display device, and more particularly, to an organic light emitting display device with improved viewing angles.

2. Description of the Related Art

Organic light emitting display devices are self-emissive display devices that generate light. The light is generated by a re-combination of electrons and holes in an organic emissive layer when a voltage is applied to an organic film containing the organic emission layer. The organic film includes an anode, a cathode, and the organic emissive layer that is interposed between the anode and the cathode. Organic light emitting display devices are expected to be the next generation display devices due to their advantages as compared to those of cathode ray tubes (CRTs) or liquid crystal displays (LCDs). Such advantages include being light weight, being thin in thickness, having wide viewing angles, having short response times, and having a low power consumption rate.

In organic light emitting display devices, an organic light emitting device is disposed in a display region. The organic light emitting device includes a first electrode and a second electrode that face each other, and an emissive layer interposed between the first electrode and the second electrode. Since the organic light emitting device is easily damaged by moisture or oxygen penetrating from the outside, the organic light emitting display device is sealed so that penetration of moisture or oxygen from the outside can be prevented or reduced.

SUMMARY OF THE INVENTION

Aspects of the present invention include an organic light emitting display device with improved viewing angles.

According to an aspect of the present invention, an organic light emitting display device includes: a substrate; a display unit that is formed on the substrate, and comprises a plurality of organic light emitting regions that emit light; a sealing member disposed above the display unit; and one or more a light absorption pattern units formed on a plurality of non-light emitting regions of the display unit.

According to an aspect of the present invention, the light absorption pattern unit may be formed to define each of the organic light emitting regions.

According to an aspect of the present invention, the light absorption pattern unit may reduce light emitted from each of the organic light emitting regions from being mixed with each other.

According to an aspect of the present invention, the organic light emitting display device may further comprise a black matrix formed on a surface of the sealing member to correspond to the non-light emitting region of the display unit.

According to an aspect of the present invention, the organic light emitting display device may further comprise color filters formed on a surface of the sealing member to correspond to each of the organic light emitting regions.

According to another aspect of the present invention, an organic light emitting display device includes: a substrate; a first electrode formed on the substrate; a pixel defining layer that is formed on the first electrode, and exposes a portion of the first electrode; an intermediate layer comprising an emissive layer, and formed on the exposed portion of the first electrode; a second electrode disposed on the pixel defining layer and the intermediate layer; and a light absorption pattern unit formed on the second electrode to correspond to the pixel defining layer.

According to an aspect of the present invention, the light absorption pattern unit may be formed to define the intermediate layer.

According to an aspect of the present invention, the light absorption pattern unit may reduce light emitted from the intermediate layer from being mixed with each other.

According to an aspect of the present invention, the organic light emitting display device may further comprise a black matrix formed on a surface of the sealing member to correspond to the pixel defining layer.

According to an aspect of the present invention, the organic light emitting display device may further comprise a color filter formed on a surface of the sealing member to correspond to the pixel defining layer.

According to another aspect of the present invention, an organic light emitting display device includes: a substrate; a first electrode formed on the substrate; a pixel defining layer that is formed on the first electrode and exposes a portion of the first electrode; an intermediate layer comprising an emissive layer, and formed on the exposed portion of the first electrode; a light absorption pattern unit formed on the pixel defining layer; and a second electrode formed to cover the intermediate layer and the light absorption pattern layer.

According to an aspect of the present invention, the light absorption pattern unit may be formed to define the intermediate layer.

According to an aspect of the present invention, the light absorption pattern unit may reduce light emitted from the intermediate layer from being mixed with each other.

According to an aspect of the present invention, the organic light emitting display device may further comprise a black matrix formed on a surface of the sealing member to correspond to the pixel defining layer.

According to an aspect of the present invention, the organic light emitting display device may further comprise a color filter formed on a surface of the sealing member to correspond to the pixel defining layer.

According to an aspect of the present invention, an organic light emitting display device includes an organic light emitting device to emit light, the organic light emitting device including an organic light emitting layer to define a light emitting region of the organic light emitting device, and a pixel define layer to define a non-light emitting region of the organic light emitting device; and a sealing member placed over the organic light emitting device and used to form a sealed space between the organic light emitting device and the sealing member, the sealing member including a black matrix to absorb light, the black matrix being formed on a surface of the sealing member at a location that corresponds to the non-light emitting region of the organic light emitting device.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the aspects, taken in conjunction with the accompanying drawings of which.

DETAILED DESCRIPTION OF THE EMBODIMENTS

Figure 1:
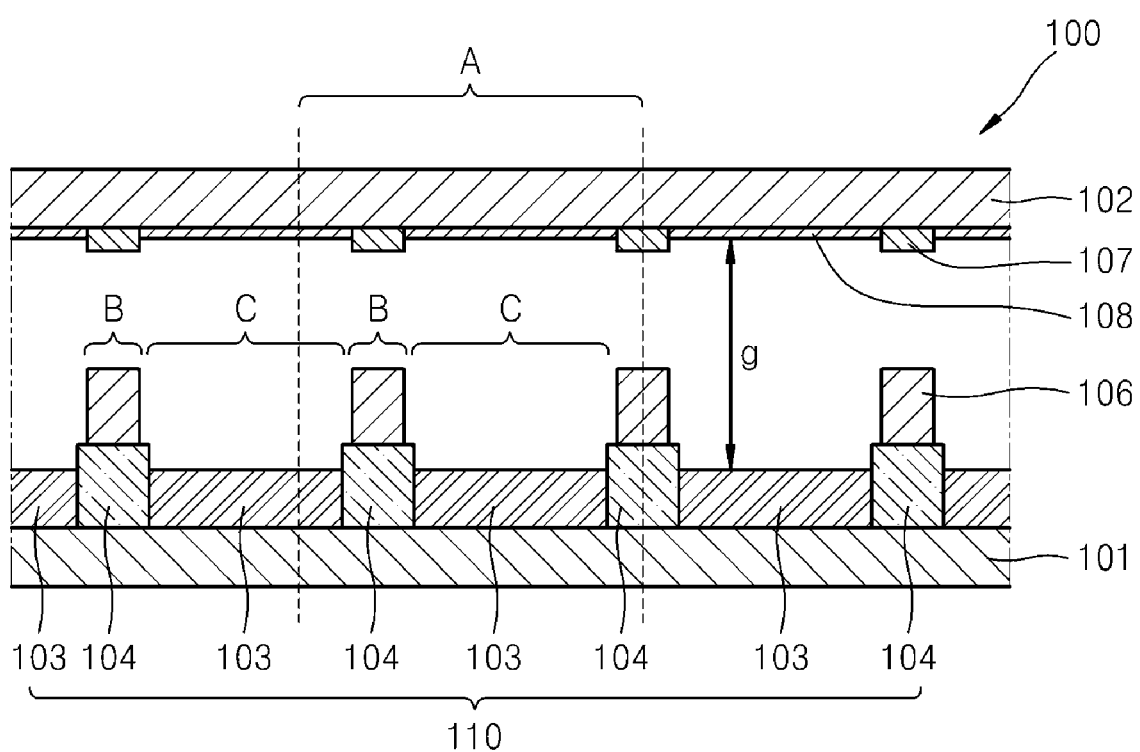
FIG. 1 is a schematic cross-sectional view of an organic light emitting display device according to an aspect of the present invention.

Reference will now be made in detail to aspects of the present invention, examples of which are illustrated in the accompanying drawings, wherein like reference numerals refer to the like elements throughout. The aspects are described below in order to explain the present invention by referring to the figures.

Figure 2:
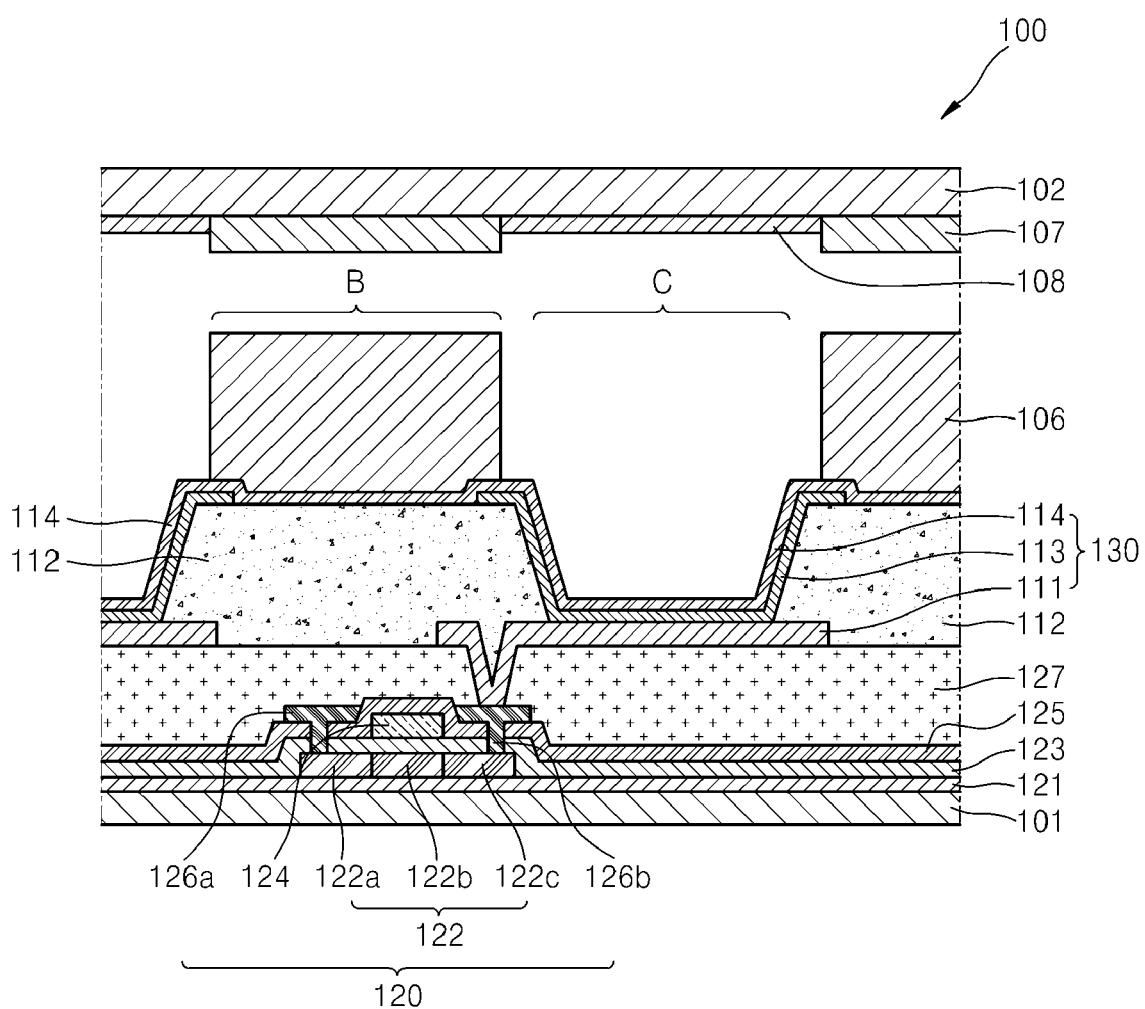
FIG. 2 is an enlarged cross-sectional view of portion A of FIG. 1 according to an aspect of the present invention.

FIG. 1 is a schematic cross-sectional view of an organic light emitting display device 100 according to an aspect of the present invention. FIG. 2 is an enlarged cross-sectional view of portion A of FIG. 1 according to an aspect of the present invention. Referring to FIG. 1, the organic light emitting display device 100 includes a substrate 101, a sealing member 102, a display unit 110, a plurality of light absorption pattern units 106, black matrices 107, and color filters 108.

The substrate 101 can be formed of a material such as transparent glass, plastic sheet, or silicon, and may be flexible or inflexible, and transparent or opaque. However, aspects of the present invention are not limited thereto, and the substrate 101 may also be formed of a metal plate.

The display unit 110 is formed on the substrate 101, and may include a plurality of organic light emitting regions 103 that emit light, and a plurality of non-light emitting regions 104 that do not emit light. The organic light emitting region 103 may include an organic light emitting device that is self-emissive, and the non-light emitting region 104 may be a pixel defining layer. The organic light emitting region 103 may include an RGB independent light emitting device (or an individual red, green, or blue light emitting device) that emits red light (R), green light (G), or blue light (B). In addition, the organic light emitting region 103 may include a white organic light emitting device that emits white light (W).

In the case when the organic light emitting display device 100 is an active matrix type, as shown in FIG. 2, the display unit 110 may include a plurality of organic light emitting devices 130, which are self-emissive, and thin film transistors 120. The organic light emitting devices 130 and the thin film transistors 120 will be described in detail later with reference to FIG. 2.

The display unit 110 includes a light emitting region C, where the organic light emitting device 130 is formed, and a non-light emitting region B, where the organic light emitting device 130 is not formed. The light absorption pattern unit 106 may be disposed in the non-light emitting region B, as shown in FIG. 1, as will be described later in greater detail with reference to FIG. 2. Aspects of the present invention is not limited to the organic light emitting display device 100 of an active matrix type, but can also be applied to an organic light emitting display device of a passive matrix type, for example, or other types.

The sealing member 102 is disposed on an upper side of the display unit 110 and may be combined with the substrate 101. As illustrated in FIG. 1, the sealing member 102 may be disposed separately from the display unit 110, and can be joined with the substrate 101 using an adhesion member or an adhesive (not shown) at peripheries thereof, for example. The sealing member 102 can be a glass substrate, but also various plastic substrates formed of, for example, acryl, or other polymers.

In the case when the organic light emitting display device 100 is a top emission type device, the sealing member 102 can be formed of an electrical insulating material having high transparency with respect to light generated from the display unit 110. Examples of the electrical insulating material includes a transparent glass, such as alkali glass and non-alkali glass, transparent ceramics, such as zirconia and quartz, and polymers, such as polyethylene terephthalate, polycarbonate, polyether sulfone, polyvinyl fluoride (PVF), and polyacrylate. The black matrix 107 or the color filters 108 may be formed on a surface of the sealing member 102 to improve light isolation, and to enhance color, respectively.

As shown in FIG. 1, the light absorption pattern unit 106 may be formed on the non-light emitting region 104 of the display unit 110. The non-light emitting region 104 may include a pixel defining layer 112, and thus, the light absorption pattern unit 106 may be formed on the pixel defining layer 112, as will be shown in more detail with reference to FIG. 2. The light absorption pattern unit 106 may be formed on a second electrode 114 corresponding to the pixel defining layer 112.

The light absorption pattern units 106 may be formed to define each of the organic light emitting regions 103. That is, one organic light emitting region 103 may be formed between adjacent light absorption pattern units 106. The light absorption pattern units 106 may reduce or prevent light emitted from each of the organic light emitting regions 103 from being mixed with each other. That is, the light absorption pattern units 106 reduce leakage of light from one organic light emitting region 103 to another organic light emitting region 103.

In particular, a gap g exists between the sealing member 102 and the display unit 110, which is referred to as a cell gap g. In general, the cell gap g may be 5 µm or more. Due to the presence of the cell gap g, and in the absence of the light absorption pattern units 106, light emitted from each of the organic light emitting regions 103 can be mixed with each other. If lights emitted from different organic light emitting regions 103 are mixed with each other, viewing angles become small. In aspects of the present invention, the cell gap g may be defined from a surface of the organic light emitting region 103 to a surface of the color filters 108, as shown in FIG. 1, but such is not necessary.

The light absorption pattern units 106 used in aspects of the present invention each has a predetermined height, which may be constant, and are formed on the non-light emitting region 104 to define each of the organic light emitting regions 103. Thus, the light absorption pattern units 106 can prevent or reduce lights emitted from each of the organic light emitting regions 103 from being mixed with each other. Thus, the light absorption pattern units 106 prevent or mitigate the viewing angles from becoming smaller or reduced.

The height of the light absorption pattern unit 106 may be in a range of 2 to 3 µm, and the light absorption pattern unit 106 may comprise a material having a high light absorption coefficient. For example, the light absorption pattern unit 106 may comprise a polymer organic material having a high light absorption coefficient, such as carbon black.

Since the light absorption pattern unit 106 has a constant height as described above and is formed on the non-light emitting region 104, a distance between the sealing member 102 and the display unit 110 can be maintained constant. That is, the light absorption pattern unit 106 prevents the sealing member 102 from contacting the display unit 110 or portions thereof. The light absorption pattern unit 106 maintains the constant distance between the sealing member 102 and the display unit 110, and thus, can prevent or reduce Newton's ring that may occur if the distance between the sealing member 102 and the display unit 110 is not constant. As described above, the light absorption pattern unit 106 has a constant height and is formed on each of the non-light emitting region 104 that defines the organic light emitting regions 103. Thus, the distance between the sealing member 102 and the display unit 110 is maintained constant, and Newton's ring can be prevented or reduced, accordingly.

The black matrix 107 may be formed on a surface of the sealing member 102 to correspond to each of the non-light emitting regions 104. As illustrated in FIGS. 1 and 2, the black matrix 107 may be formed on a bottom surface of the sealing member 102, which faces the display unit 110. Alternatively, the black matrix 107 may be formed on a top surface of the sealing member 102, which is opposite to (or faces away from) the display unit 110. In either case, the black matrix 107 absorbs light incident from the outside, thus reducing reflection of an external light and resulting in an improvement in light room contrast of the organic light emitting display device 100. The black matrix 107 may comprise an organic polymer resin having a low light reflectance and/or high light absorption coefficient. In aspects of the present invention, the black matrix 107 may be formed of the polymer organic material of the light absorption pattern 106, though such is not necessary.

In other aspects of the present invention, the black matrix 107 may be formed on both the bottom and top surfaces of the sealing member 102. If so, the black matrices 107 on the bottom and top surfaces of the sealing member 102 may be aligned so that the black matrix 107 on the bottom surface and the black matrix 107 on the top surface on corresponding positions of the sealing member. Nevertheless, it is understood that the black matrix 107 on the bottom surface and the black matrix 107 on the top surface need not be so aligned.

The color filters 108 may be formed on a surface of the sealing member 102 to correspond to each of the organic light emitting regions 103. As illustrated in FIGS. 1 and 2, the color filters 108 may be formed on the bottom surface of the sealing member 102, which faces the display unit 110. Alternatively, the color filters 108 may be formed on the top surface of the sealing member 102, which is opposite to the display unit 110. The color filters 108 may include a red filter (R), a green filter (G), and/or a blue filter (B).

When the organic light emitting region 103 is an RGB independent light emitting device, the red filter may be formed on a surface of the sealing member 102 to correspond to the organic light emitting region 103 that emits a red light. In addition, the green filter may be formed on a surface of the sealing member 102 to correspond to the organic light emitting region 103 that emits a green light, and the blue filter may be formed on a surface of the sealing member 102 to correspond to the organic light emitting region 103 that emits a blue light. When the color filters 108 is used in the RGB independent light emitting device, the organic light emitting display device 100 can have improved color purity, thereby resulting in improvement in color reproduction. When the organic light emitting region 103 is a white organic light emitting device, red, green and blue colors can be realized in the organic light emitting regions 103 by an RGB color filters 108. For example, the respective red, green and blue colors can be realized in the white organic light emitting regions 103 by a respective red, green, and blue color filters 108.

FIG. 2 is an enlarged cross-sectional view of portion A of FIG. 1 according to an aspect of the present invention. That is, FIG. 2 shows a specific configuration of the display unit 110. Referring to FIG. 2, the thin film transistors 120 are formed on the substrate 101, and the organic light emitting device 130 is formed on each of the thin film transistors 120. The organic light emitting devices 130 may each include a first electrode 111 that is electrically connected to the thin film transistors 120, a second electrode 114 disposed on or over an entire surface of the substrate 101, and an intermediate layer 113 that is disposed between the first electrode 111 and the second electrode 114 and which includes at least an emissive layer.

The thin film transistors 120 formed on the substrate 101 may each include a gate electrode 124, a source electrode 126a and a drain electrode 126b, a semiconductor layer 122, a gate insulating layer 123 (or a portion thereof), and an interlayer insulating layer 125 (or a portion thereof). The shape of the thin film transistor 120 is not limited to the shape illustrated in FIG. 2, and various thin film transistors, such as an organic thin film transistor in which the semiconductor layer 122 is formed of an organic material, or a silicon thin film transistor in which the semiconductor layer 122 is formed of silicon, can be used. If necessary, though not required, a buffer layer 121 formed of silicon oxide ($SiO_2$), silicon nitride ($SiN_x$), or silicon oxynitride ($SiO_xN_y$) can further be formed between the thin film transistor 120 and the substrate 101 so as to prevent or reduce penetration of impurities that may be generated from the substrate 101, into the semiconductor layer 122, thus improving characteristics of the organic light emitting display device 100.

The semiconductor layer 122 is formed on the buffer layer 121, and may be an amorphous or crystalline silicon film, for example. The semiconductor layer 122 may include a source region 122a, a drain region 122c, and a channel region 122b. Also, the semiconductor layer 122 is buried by the gate insulating layer 123. The gate electrode 124, corresponding to the semiconductor layer 122, and the interlayer insulating layer 125 that buries the gate electrode 124 are disposed on the gate insulating film 123. Additionally, the source electrode 126a and the drain electrode 126b are respectively in contact with the source region 122a and the drain region 122c through contact holes formed in the gate insulating layer 123 and the interlayer insulating layer 125.

The organic light emitting device 130 includes the first electrode 111 and the second electrode 114 that face each other, and the intermediate layer 113 that is interposed between the first electrode 111 and the second electrode 114. The intermediate layer 113 is formed of an organic material. The intermediate layer 113 includes at least an emissive layer, and can include a plurality of layers, as will be described later.

The first electrode 111 functions as an anode, and the second electrode 114 functions as a cathode. Also, the polarity of the first electrode 111 and the second electrode 114 may be opposite to each other. The first electrode 111 may be a transparent electrode or a reflective electrode. When the first electrode 111 is a transparent electrode, the first electrode 111 may include ITO, IZO, ZnO, or $In_2O_3$, for example. When the first electrode 111 is a reflective electrode, the first electrode 111 can include a reflective film formed of Ag, Mg, Al, Pt, Pd, Au, Ni, Nd, Ir, Cr, or a compound of these materials, and a film formed of ITO, IZO, ZnO, or $In_2O_3$ on the reflective film.

The second electrode 114 may also be a transparent electrode or a reflective electrode. When the second electrode 114 is a transparent electrode, the second electrode 114 may include a film deposited to face the intermediate layer 113 interposed between the first electrode 111 and the second electrode 114, and an auxiliary electrode or a bus electrode line formed of a material used to form the transparent electrode on the film. The film of the second electrode 114 may be formed of Li, Ca, LiF/Ca, LiF/Al, Al, Mg, or a compound of these materials, and the auxiliary electrode or a bus electrode line may be ITO, IZO, ZnO, or $In_2O_3$, for example. On the other hand, when the second electrode 114 is a reflective electrode, the second electrode 114 can be formed by depositing Li, Ca, LiF/Ca, LiF/Al, Al, Mg, or a compound of these materials as the second electrode 114.

The pixel defining layer 112 covers edges and portions of a top surface of the first electrode 111 that are close to the edges of the first electrode 111. The pixel defining layer 112 is formed to have a predetermined thickness in portions where the pixel defining layer 112 is not formed over the first electrode 111. The pixel defining layer 112 defines a light emitting region, and also widens a gap or a distance between the respective edges of the first electrode 111 and the second electrode 114, thus preventing or reducing an occurrence of an electric field concentration phenomenon at the edges of the first electrode 111. As a result, the pixel defining layer 112 prevents or reduces the first electrode 111 and the second electrode 114 from developing a short circuit.

Various intermediate layers 113 that include at least an emissive layer can be formed between the first electrode 111 and the second electrode 114. The intermediate layer 113 may be formed of a small molecular organic material or a polymer organic material.

When the intermediate layer 113 is formed of the small molecular organic material, the intermediate layer 113 may be formed in a single or composite structure including a hole injection layer (HIL), a hole transport layer (HTL), an organic emission layer (EML), an electron transport layer (ETL), or an electron injection layer (EIL). The organic material that can be used to form the intermediate layer 113 includes copper phthalocyanine (CuPc), N,N'-Di(naphthalene-1-yl)-N,N'-diphenylbenzidine (NPB), and tris-8-hydroxyquinoline aluminum (Alq3). The intermediate layer 113 formed of this small molecular organic material may be formed by vacuum deposition using masks.

The intermediate layer 113 formed of the polymer organic material may include an HTL and an EML. The HTL may be formed of poly-(3,4)-ethylene-dihydroxy thiophene (PEDOT), and the emissive layer may be formed of a polymer organic material such as polyphenylene vinylenes (PPVs) and polyfluorenes.

The organic light emitting device 130 is electrically connected to the thin film transistor 120 formed therebelow. In this case, if a planarizing film 127 is formed to cover the thin film transistor 120, the organic light emitting device 130 is disposed on the planarizing film 127, and the first electrode 111 of the organic light emitting device 130 is electrically connected to the thin film transistor 120 through a contact hole formed in the planarizing film 127.

Figure 3:
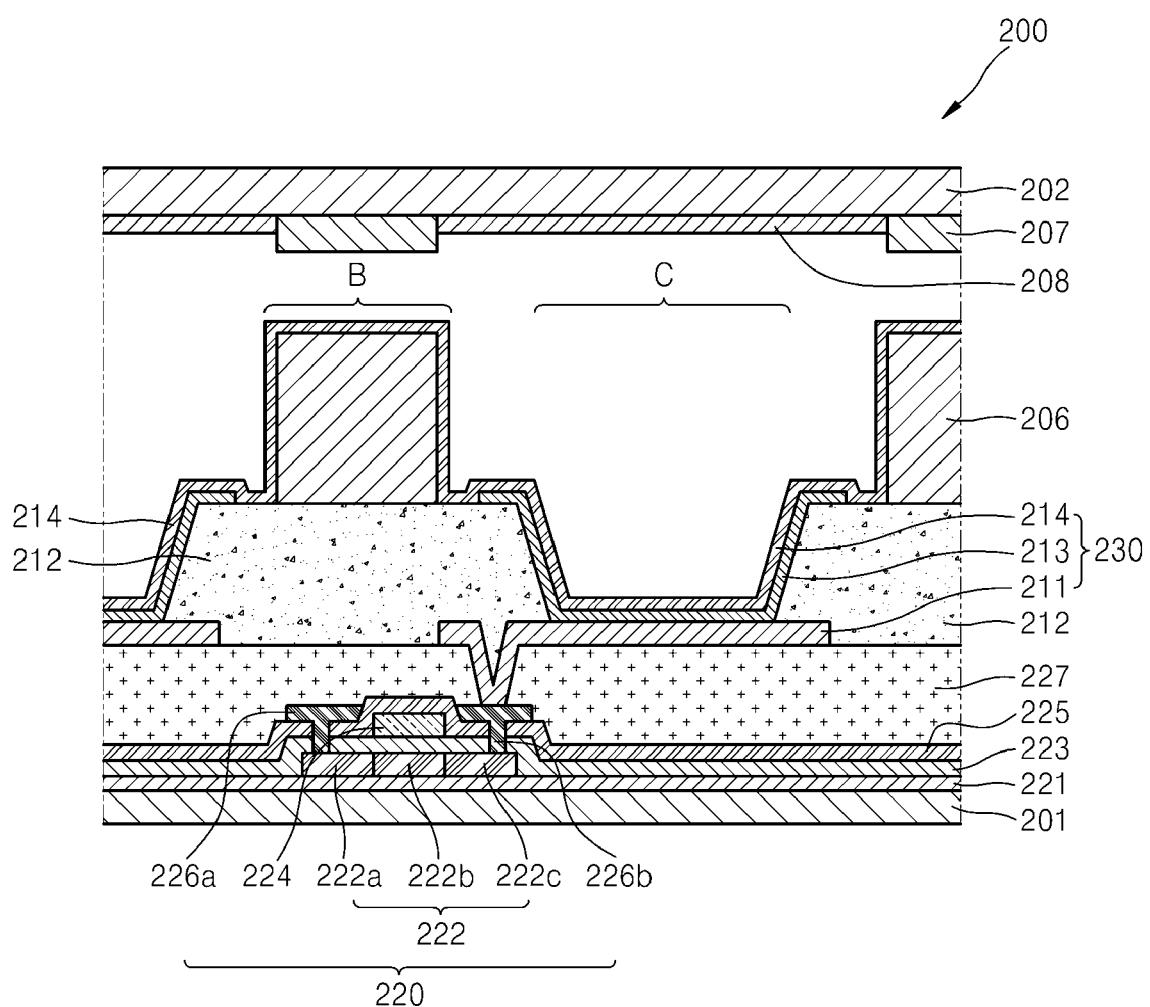
FIG. 3 is a schematic cross-sectional view of an organic light emitting display device according to another aspect of the present invention.

FIG. 3 is a schematic cross-sectional view of an organic light emitting display device 200 according to another aspect of the present invention. The organic light emitting display device 200 illustrated in FIG. 3 has a structure different from that of the organic light emitting display device 100 illustrated in FIG. 2. Specifically, a position of a light absorption pattern unit 206 of the organic light emitting display device 200 is different from a position of the light absorption pattern unit 106 of the organic light emitting display device 100.

On the other hand, the following of the organic light emitting display device 200 correspond to those of the organic light emitting display device 100. Namely, a substrate 201, a buffer layer 221, a semiconductor layer 222, a source region 222a, a drain region 222c, a channel region 222b, a gate electrode 224, a source electrode 226a, a drain electrode 226b, a gate insulating layer 223, an interlayer insulating layer 225, a planarizing film 227, a pixel defining layer 212, an organic light emitting device 230, a first electrode 211, an intermediate layer 213, a black matrix 207, a color filter 208, and an sealing member 202 in the organic light emitting display device 200 of FIG. 3 respectively correspond to the substrate 101, the buffer layer 121, the semiconductor layer 122, the source region 122a, the drain region 122c, the channel region 122b, the gate electrode 124, the source electrode 126a, the drain electrode 126b, the gate insulating layer 123, the interlayer insulating layer 125, the planarizing film 127, the pixel defining layer 112, the organic light emitting device 130, the first electrode 111, the intermediate layer 113, the black matrix 107, the color filters 108, and the sealing member 102 in the organic light emitting display device 100 of FIG. 2. Thus, descriptions thereof will be omitted herein.

Referring to FIG. 3, the light absorption pattern unit 206 is formed on the pixel defining layer 212, and a second electrode 214 may be formed to cover the intermediate layer 213 and the light absorption pattern unit 206. While the light absorption pattern unit 106 of the organic light emitting display device 100 of FIG. 2 is formed on the second electrode 114 to correspond to the pixel defining layer 112, however, the light absorption pattern unit 206 of the organic light emitting display device 200 of FIG. 3 is directly formed on the pixel defining layer 212.

In addition, the second electrode 214 may be formed to cover both the intermediate layer 213 and the light absorption pattern unit 206. In the case of when the organic light emitting display device 200 is a top emission type, the second electrode 214 is a transparent electrode. Thus, although the second electrode 214 is formed to cover the light absorption pattern unit 206, the light absorption pattern unit 206 prevents or reduces light emitted from the organic light emitting device 230 from being mixed with each other, thereby resulting in improvement in viewing angles.

In aspects of the present invention, the light emitting region may be referred to as a pixel or a pixel region.

In FIGS. 1-3, the black matrices 107, 207 are shown as thinner or shorter than the light absorption pattern 106, 206, respectively. However, such is not necessary, and in other aspects of the present invention, the black matrices 107, 207 may be thicker or longer and the light absorption pattern 106, 206, may be thinner or shorter. That is, the black matrices 107, 207 may be formed to almost contact the light absorption pattern 106, 206 at a midpoint of the gap g, or the black matrices 107, 207 may be formed to almost contact the light absorption pattern 106, 206 at a point that is closer to a substrate side than the sealing member side of the organic light emitting diode device.

In aspects of the present invention, dimensions of layers and regions may be exaggerated for clarity. It will also be understood that when a layer or element is referred to as being "on" or "over" another layer or substrate, it can be directly on the other layer or substrate, or intervening layers may also be present. Further, it will be understood that when a layer is referred to as being "under" or "below" another layer, it can be directly under, or one or more intervening layers may also be present.

Accordingly, an organic light emitting display device according to aspects of the present invention can have improved viewing angle and prevent or reduce deterioration in color purity.

Although a aspects of the present invention have been shown and described, it would be appreciated by those skilled in the art that changes may be made in the aspects without departing from the principles and spirit of the invention, the scope of which is defined in the claims and their equivalents.

What is claimed is:

1. An organic light emitting display device comprising:
   a substrate;
   a display unit formed on the substrate and comprising a plurality of organic light emitting regions and a plurality of non-light emitting regions;
   a sealing member above the display unit, the sealing member forming a sealed air space between the display unit and the sealing member, the sealed air space including first air spaces directly over the organic light emitting regions and below the sealing member, and second air spaces directly over the non-light emitting regions and below the sealing member; and
   light absorption pattern units formed on the non-light emitting regions,
   wherein the light absorption pattern units are configured with a height sufficient
      to prevent the sealing member from contacting the display unit, and
      to prevent all light from one of the organic light emitting regions from directly entering ones of the first air spaces corresponding to adjacent ones of the organic light emitting regions.

2. The organic light emitting display device of claim 1, wherein the light absorption pattern units are formed of a material having a high light absorption coefficient.

3. The organic light emitting display device of claim 1, wherein the light absorption pattern units are configured
   to absorb light emitted from the organic light emitting regions toward the sealing member and
   to reduce mixing of light of different ones of the organic light emitting regions with each other.

4. The organic light emitting display device of claim 1, further comprising black matrices formed on the sealing member to correspond to the non-light emitting regions.

5. The organic light emitting display device of claim 1, further comprising color filters formed on the sealing member to correspond to the organic light emitting regions.

6. The organic light emitting display device of claim 1, wherein the height of the light absorption pattern units is in a range from about 2 to 3 μm.

7. An organic light emitting display device comprising:
   a substrate;
   a first electrode formed on the substrate;
   a sealing member covering the substrate;
   a display unit formed on the substrate and between the sealing member and the substrate, the display unit comprising a plurality of organic light emitting regions and a plurality of non-light emitting regions, the display unit and the sealing member defining a corresponding plurality of first spaces directly over the plurality of organic light emitting regions and below the sealing member, and a corresponding plurality of second spaces directly over the plurality of non-light emitting regions and below the sealing member, the display unit comprising:
      a pixel defining layer formed on the first electrode and defining an opening to expose a portion of the first electrode;
      an intermediate layer comprising an emissive layer and formed on the exposed portion of the first electrode;
      a second electrode formed on the pixel defining layer and the intermediate layer; and
      a light absorption pattern unit consisting essentially of a polymer organic material and formed on the second electrode to correspond to the pixel defining layer,
   wherein the light absorption pattern unit is between a first one of the organic light emitting regions and a second one of the light emitting regions, and configured with a height sufficient to prevent all light from the first one of the organic light emitting regions from directly entering one of the first spaces corresponding to the second one of the organic light emitting regions.

8. The organic light emitting display device of claim 7, wherein the height of the light absorption pattern unit is in a range from about 2 to 3 μm.

9. The organic light emitting display device of claim 7, wherein the light absorption pattern unit is configured to absorb light emitted from the intermediate layer, such that mixing of the light with light emitted from another intermediate layer is reduced.

10. The organic light emitting display device of claim 7, further comprising:
    a black matrix formed on the sealing member to correspond to the pixel defining layer.

11. The organic light emitting display device of claim 7, further comprising:
    a color filter formed on the sealing member to correspond to the intermediate layer.

12. The organic light emitting display device of claim 7, wherein the light absorption pattern unit is formed of a material having a high light absorption coefficient.

13. An organic light emitting display device comprising:
    a substrate;
    a first electrode formed on the substrate;
    a sealing member covering the substrate;
    a display unit formed on the substrate and between the sealing member and the substrate, the display unit comprising a plurality of organic light emitting regions and a plurality of non-light emitting regions, the display unit and the sealing member defining a corresponding plurality of first spaces directly over the plurality of light emitting regions and below the sealing member, and a corresponding plurality of second spaces directly over the plurality of non-light emitting regions and below the sealing member, the display unit comprising:
       a pixel defining layer formed on the first electrode and defining an opening to expose a portion of the first electrode;
       an intermediate layer comprising an emissive layer and formed on the exposed portion of the first electrode;
       a light absorption pattern unit formed on the pixel defining layer, a top surface of the light absorption pattern unit being above a top surface of the intermediate layer; and
       a second electrode formed on the intermediate layer and the top surface of the light absorption pattern unit,
    wherein the light absorption pattern unit is between a first one of the organic light emitting regions and a second one of the light emitting regions, and configured with a height sufficient to prevent all light from the first one of the organic light emitting regions from directly entering one of the first spaces corresponding to the second one of the organic light emitting regions.

14. The organic light emitting display device of claim 13, wherein the height of the light absorption pattern unit is in a range from about 2 to 3 μm.

15. The organic light emitting display device of claim 13, wherein the light absorption pattern unit is configured to absorb light emitted from the intermediate layer, such that mixing of the light with light emitted from another intermediate layer is reduced.

16. The organic light emitting display device of claim 13, further comprising:

a black matrix formed on the sealing member to correspond to the pixel defining layer.

17. The organic light emitting display device of claim 13, further comprising:

a color filter formed on the sealing member to correspond to the intermediate layer.

18. The organic light emitting display device of claim 13, wherein the light absorption pattern unit is formed of a material having a high light absorption coefficient.

* * * * *